United States Patent [19]

Partovi et al.

[11] Patent Number: 5,576,635
[45] Date of Patent: Nov. 19, 1996

[54] OUTPUT BUFFER WITH IMPROVED TOLERANCE TO OVERVOLTAGE

[75] Inventors: Hamid Partovi, Sunnyvale; Matthew P. Crowley, Fremont, both of Calif.

[73] Assignee: Advanced Micro Devices, Inc., Sunnyvale, Calif.

[21] Appl. No.: 423,567

[22] Filed: Apr. 17, 1995

Related U.S. Application Data

[63] Continuation-in-part of Ser. No. 389,783, Feb. 14, 1995, abandoned.

[51] Int. Cl.⁶ .............................................. H03K 19/0185
[52] U.S. Cl. ............................... 326/27; 326/58; 326/83; 327/534
[58] Field of Search ................................. 326/27, 56, 57, 326/58, 83, 86; 327/379, 534

[56] References Cited

U.S. PATENT DOCUMENTS

| | | | |
|---|---|---|---|
| 4,486,674 | 12/1984 | Neely | 326/56 |
| 4,963,766 | 10/1990 | Lundberg | 326/58 |
| 5,151,619 | 9/1992 | Austin et al. | 326/57 |
| 5,160,855 | 11/1992 | Dobberpuhl | 326/62 |
| 5,315,187 | 5/1994 | Cheng | 326/27 |
| 5,338,978 | 8/1994 | Larsen et al. | 326/21 |
| 5,444,397 | 8/1995 | Wong et al. | 326/27 |
| 5,451,889 | 9/1995 | Heim et al. | 327/534 |
| 5,467,031 | 11/1995 | Nguyen et al. | 326/58 |

Primary Examiner—Edward P. Westin
Assistant Examiner—Benjamin D. Driscoll
Attorney, Agent, or Firm—Townsend and Townsend and Crew LLP

[57] ABSTRACT

An output buffer with improved tolerance to overvoltage conditions. Among other features, especially when in a high-impedance state, the output buffer prevents a leakage path from a pad (108) through a pull-up driver (101) to supply voltage VDD when any voltage above VDD is placed on the pad (108). Further, the output buffer provides improved transient response characteristics. In one embodiment, the output buffer includes a pull-up driver (101), a first tracking transistor (120), a second tracking transistor (122), a voltage bias generator (112), and a coupling capacitor (124).

37 Claims, 4 Drawing Sheets

OUTPUT BUFFER WITH IMPROVED TOLERANCE TO OVERVOLTAGE

This application is a continuation-in-part of Ser. No.08/389,783, filed Feb 14, 1995 abandoned.

BACKGROUND OF THE INVENTION

This invention relates generally to the field of integrated circuits, and more specifically, to improving the output buffer stage of CMOS digital integrated circuits.

Resulting from the continued scaling and shrinking of semiconductor device geometries, which are used to form integrated circuits (also known as "chips"), integrated circuits have progressively become smaller and denser. To facilitate these highly integrated semiconductor circuits, the typical supply voltage of 5 volts has been reduced to a voltage level less than 5 volts, commonly from about 3.3 volts to 3.6 volts. In the future, supply voltages may even be reduced even further to, for example, 2.5 volts.

Often for board-level designs, a mix of integrated circuits is used, where some of the integrated circuits are designed to use a standard 5-volt supply voltage while other integrated circuits are designed to use a reduced-level supply voltage. This poses a problem for the lower voltage integrated circuits: Lower voltage integrated circuits must be able to tolerate overvoltage situations which occur when voltage levels greater than the supply voltage level of that integrated circuit are presented at the pad of that integrated circuit. For example, a 5-volt integrated circuit may be used as input to a 3.3-volt integrated circuit; the 3.3-volt integrated circuit must be able to tolerate a signal input of 5 volts.

This situation frequently occurs on the bidirectional input and output bus of a microprocessor. With high-voltage integrated circuits feeding into low-voltage integrated circuits, the low-voltage integrated circuit may encounter excessive voltage stresses in the thin insulation or oxide layers of some of the semiconductor devices in the circuitry interfacing between the integrated circuits. Furthermore, undesirable current leakage paths are created therein resulting in a power loss and also at times, a serious CMOS latch-up condition, among other issues.

Output buffers have been designed to handle the overvoltage problem; such an output buffer is shown in FIG. 1. Output buffers similar to the one shown in FIG. 1 are described in U.S. Pat. No. 5,151,619 and U.S. Pat. No. 5,160,855.

As shown in FIG. 1, the prior art output buffer comprises a PMOS pull-up transistor 22 with a drain connected to a pad 24 and a source connected to a supply voltage VDD. The gate of PMOS transistor 22 is coupled through a passgate, formed by NMOS transistor 16 and PMOS transistor 17, to a voltage pull-up (VPU) signal 12, generated by a predriver circuit 10. The output buffer of FIG. 1 also has NMOS pull-down transistors 26 and 28 connected in series between pad 24 and another supply voltage, VSS or ground. NMOS transistor 26 has a gate connected to VDD. NMOS transistor 28 has a gate connected to a voltage pull-down (VPD) signal 14, generated by predriver circuit 10. A PMOS tracking transistor 20 is coupled between pad 24 and the gate of PMOS pull-up transistor 22. The gate of PMOS transistor 20 is connected to supply voltage VDD. For passgate transistors 16 and 17, the gate of NMOS transistor 16 is connected to supply voltage VDD and the gate of PMOS transistor 17 is connected to pad 24.

PMOS transistors 17, 20, and 22 have a n-well or substrate connection 30 which is typically a floating n-well connection. This n-well 30 is not directly connected to supply voltage VDD as is typically the case with other PMOS transistors on the integrated circuit. Because of the physical nature of a semiconductor integrated circuit, in practice, a parasitic diode (substrate diode) exists between the floating n-well and pad 24. Therefore, the n-well or substrate of PMOS transistors 17, 20, and 22 need not be physically connected together as shown in FIG. 1; rather each of these transistors may have unconnected floating n-well connections that are effectively at the same potential, all having a parasitic diode connection to pad 24. In this situation, the n-well or substrate of PMOS transistors 17, 20, and 22 will be effectively electrically, or virtually, connected.

Predriver circuit 10 has two inputs, a signal input and an output enable input. In operation, predriver circuit 10, responsive to a signal input and an output enable input, generates VPU 12 and VPD 14 signals, which drive PMOS pull-up transistor 22 and NMOS pull-down transistor 28 to provide a proper output signal voltage on pad 24. Generally, an output high voltage level (or logic high) is at about VDD and an output low voltage level (or logic low) is at about VSS. Furthermore, the output buffer of FIG. 1 has two operating states: a normal operation state and a highimpedance state (otherwise known as "tristate"). In the normal operation state, the output enable signal is a logic high while in the high-impedance state, the output enable signal is a logic low.

In the normal operation state, to produce an output high at pad 24, predriver circuit 10 produces a low signal at VPU 12 and a low signal at VPD 14. To produce an output low at pad 24, predriver circuit 10 generates a high signal at VPU 12 and a high signal at VPD 14. To produce a highimpedance (tristate) state at pad 24, predriver circuit 10 generates a high signal at VPU 12 and a low signal at VPD 14.

The output buffer of FIG. 1 solves some of the problems that occur when an overvoltage condition occurs at pad 24. An overvoltage condition occurs when a voltage level greater than the supply voltage VDD is applied at pad 24. When a high voltage is applied at pad 24, PMOS transistor 20 allows the gate of PMOS transistor 22 to track the voltage at pad 24 to prevent a leakage current path from pad 24 through the drain-to-source path of PMOS transistor 22 to supply voltage VDD. In operation, the floating n-well connection 30 for PMOS transistors 17, 20, and 22 helps prevent the occurrence of a latch-up condition. This n-well 30 is not directly connected to supply voltage VDD as is typically the case with other PMOS transistors on the integrated circuit. Since there is a parasitic diode (substrate diode) between pad 24 and the n-well connection 30 of PMOS transistors 17, 20, and 22, the n-well of these transistors will track the pad voltage when a voltage above VDD is applied to the pad. Moreover, the n-well voltage will be about the pad voltage less a threshold voltage of the parasitic diode. This prevents forward biasing the parasitic diode of PMOS transistors 17, 20, and 22, thus preventing the occurrence of a latch-up condition.

However, while the prior art circuit addresses this overvoltage problem of leakage current, it fails to recognize or address a number of other problems, both in overvoltage situations and normal operations. For ease of reference these additional problems will be referred to by number, with the order being of no significance.

Problem 1. The prior art circuit's solution to the leakage current path problem only addresses the situation occurring when the voltage at pad 24 is greater than VDD+ |VTP|(|VTP| is the threshold voltage of PMOS transistor 20 including body effect ). However, a problem of the prior art output buffer occurs when PMOS pull-up transistor 22 tristates after a low-to-high transition at pad 24.

The gateof PMOS transistor 22 can only charge to VDD − VTN (VTN is the threshold voltage of NMOS transistor 16 including body effect) through NMOS transistor 16. Thus, PMOS transistor 22 remains on. If pad 24 is externally driven to some voltage above VDD, but just under VDD +|VTP|, PMOS transistor 20, whose task is to drive the gate of PMOS transistor 22 to the voltage level at pad 24 when the voltage level at pad 24 exceeds VDD, does not turn on. As a result, the source-to-gate voltage of PMOS transistor 22 is equal to |VTP|+ VTN, which causes very serious leakage into the supply voltage VDD through PMOS transistor 22.

A potentially significant problem exists since a large amount of current may be directed into supply voltage VDD from pad 24, especially in cases where the integrated circuit has a large number of bidirectional pads such as in a 64-bit bus microprocessor. Furthermore, significant leakage currents will reduce the life span of an integrated circuit due to hot electrons and the electromigration phenomenon degrading the electrical characteristics of semiconductor devices and other electrical materials on the integrated circuit.

PROBLEM 2

In normal operation (when the output enable signal is high), a high-to-low transition at pad 24 suffers a built-in crossover current because the turn-off of PMOS pull-up transistor 22 is not completed until NMOS pull-down transistors 26 and 28 have adequately discharged pad 24.

More specifically, since the gate of PMOS transistor 17 is directly connected to pad 24, PMOS pull-up transistor 17 is not on until pad 24 is at about VSS or ground. Until PMOS transistor 17 turns on, the highest voltage at the gate of PMOS pull-up transistor 22 will be VDD −VTN, which is the voltage passed through NMOS transistor 16. Consequently, PMOS pull-up transistor 22 is still on and crossover current flows through PMOS pull-up transistor 22 to ground. The crossover current continues until PMOS transistor 17 turns on (which occurs when pad 24 is at about VSS or ground); then, the voltage at gate of PMOS pull-up transistor 22 will be about VDD, which is the voltage passed through PMOS transistor 17. PMOS pull-up transistor 22 will turn off and crossover current stops flowing.

This transient crossover current poses some problems, including causing ground bounce. There could potentially be a large magnitude of ground bounce, which would occur when many output buffers are switching at the same time in the same direction and the particular integrated circuit has a especially wide bus, such as the case of a 64-bit microprocessor. Furthermore, the crossover current tends to delay the high-to-low transition transient response at pad 24, which is undesirable in the design of high-speed integrated circuits.

PROBLEM 3

Yet another problem of the output buffer of FIG. 1 occurs during the high-impedance state. When pad 24 switches from a low voltage to a voltage greater than VDD +|VTP|, the gate of PMOS transistor 22 is capacitively coupled above VDD. This increases the source bias on PMOS transistor 17, effectively turning it on, allowing a transient current to flow back into predriver circuit 10. This transient current accelerates the electromigration phenomenon, which will degrade the electrical characteristics of the circuitry in predriver circuit 10, effectively decreasing the life span of the integrated circuit.

From the above, it is seen that an improved output buffer that is tolerant to overvoltage is needed.

SUMMARY OF THE INVENTION

The present invention provides an output buffer circuit with improved tolerance to overvoltage, making it capable of communicating with devices that operate at voltages above the supply voltage of the output buffer, which often occur on a bidirectional input and output bus. In addition to solving the known overvoltage problems addressed by the prior art circuits, the present invention recognizes and addresses the leakage current, transient current, and crossover current problems not previously recognized.

The output buffer circuit communicates a signal from circuitry internal to an integrated circuit to a pad. This pad often interfaces with external electronic components and is suitable for use in a bidirectional input and output bus of a microprocessor, memory, or other integrated circuit.

The output buffer has two operating states: a normal operation state and a high-impedance state. In the normal operation state, responsive to the internal signal, a pull-up driver and pull-down driver cooperatively drive the pad either low or high. In the high-impedance state, the pad is a high impedance.

In particular, the pull-up driver of the output buffer is for operatively coupling a first supply voltage VDD to the pad while the pull-down driver is for operatively coupling a second supply voltage VSS to the pad. To produce a high, the pull-up driver couples VDD to the pad while the pull-down driver decouples VSS from the pad. For a low, the pull-up driver decouples VDD and the pull-down driver couples VSS. For a high impedance, both VDD and VSS are decoupled.

More specifically, in one embodiment, in accordance with the teachings of this invention, an output buffer, having a normal operation state and a high-impedance state, with improved tolerance to overvoltage is provided which includes: a pad, for providing and receiving a signal; a passgate, including a first transistor having a gate coupled to a first supply voltage and a second transistor coupled in parallel with the first transistor and having a gate coupled to a voltage bias node; a voltage bias generator, coupled to the voltage bias node, for generating a first reference voltage when the output buffer is in the normal operation state and a second reference voltage when the output buffer is in the high-impedance state; and a pull-up transistor, having a source-to-drain path operatively coupling the first supply voltage to the pad, wherein the pull-up transistor provides a controlled variable impedance along the source-to-drain path in response to a control signal from a predriver coupled to a gate of the pull-up transistor through the passgate.

The present invention further includes: a first tracking transistor, coupled between a gate of the pull-up transistor and the pad and having a gate coupled to the first supply voltage; a second tracking transistor, coupled between the pad and the voltage bias node and having a gate coupled to the first supply voltage; and a coupling capacitor, coupled between the pad and the voltage bias node.

In a further embodiment, the voltage bias generator generates the second reference voltage, which is about equal to a pad voltage when the pad voltage is greater than the first supply voltage plus a transistor threshold voltage. Moreover, the second reference voltage is less than the first supply voltage less the transistor threshold voltage when the pad voltage is less than the first supply voltage plus the transistor threshold voltage.

Other objects, features, and advantages of the present invention will become apparent upon consideration of the following detailed description and the accompanying drawings, in which like reference designations represent like features throughout the figures.

DETAILED DESCRIPTION OF SPECIFIC EMBODIMENTS

OVERVEIW

Figure 2:
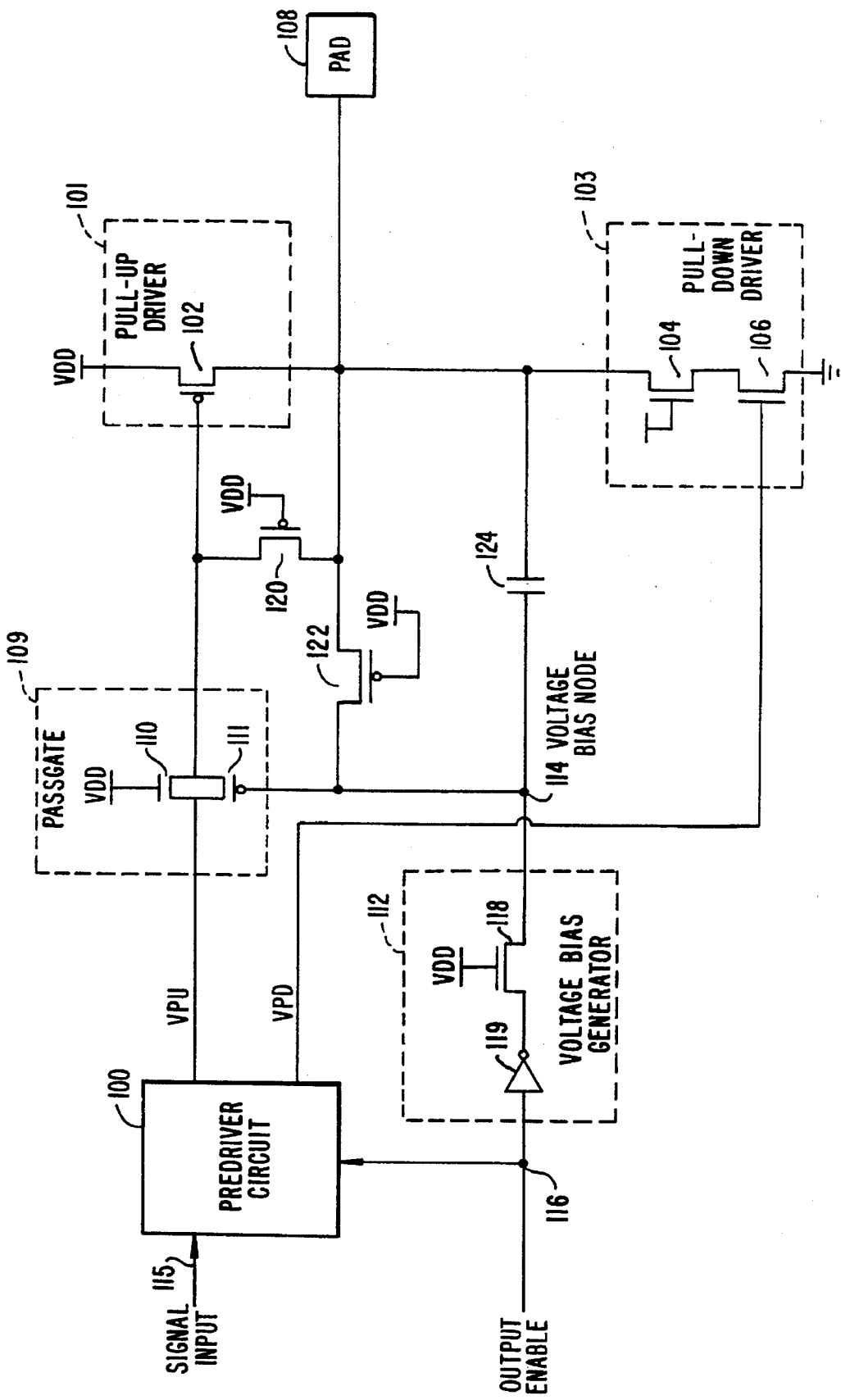
FIG. 2 depicts a CMOS output buffer of the present invention that is tolerant to overvoltage.

FIG. 2 is a circuit diagram of an embodiment of an output buffer of the present invention. The basic purpose of the present invention is to drive a signal on a line 115 onto a pad 108, subject to the state of an output enable signal 116. Pad 108 may also be coupled to receiving off-chip circuitry (not shown). To this end, a predriver circuit 100, responsive to a signal input 115 and output enable signal 116, generates a VPU and a VPD signal, which control a pull-up driver 101 and a pull-down driver 103, respectively, to provide a proper output voltage on pad 108. Pull-up driver 101 operatively couples a first supply voltage VDD to pad 108, while pull-down driver 103 operatively couples pad 108 to a second supply voltage VSS.

First supply voltage VDD is at a voltage level above second supply voltage VSS. In one embodiment, VDD is in a range from approximately 3.3 volts to approximately 3.6 volts while VSS is approximately ground or 0 volts. In other embodiments, VDD may be at a lower voltage, such as 2.5 volts or a higher voltage, such 5 volts to 6 volts. Generally, at pad 108, an output high voltage level is at about VDD and an output low voltage level is at about VSS or ground.

VPU and VPD are determined by the inputs of predriver circuit 100: the signal on line 115 and the output enable signal 116. Signal input 115 is a logic signal usually produced by internal circuitry of an integrated circuit. Furthermore, the output buffer of FIG. 2 has two operating states: a normal operation state and a high-impedance state. In the normal operation state, output enable signal 116 is a logic high while in the high-impedance state, output enable signal 116 is a logic low.

In the normal operation state, to produce an output high at pad 108, predriver circuit 100 generates a low VPU signal and a low VPD signal. To produce an output low at pad 108, predrivercircuit 100 generates a high VPU signal and a high VPD signal.- In the high-impedance state, predriver circuit 100 generates a high VPU signal and a low VPD signal to decouple PMOS pull-up driver 101 and NMOS pull-down driver 103 from pad 108.

CIRCUIT DESCRIPTION

Pull-up driver 101 comprises a PMOS pull-up transistor 102 which provides a controlled variable impedance along a source-to-drain path in response to the VPU signal, which is coupled through a passgate 109 to a gate of PMOS pull-up transistor 102. PMOS pull-up transistor 102 and other transistors in FIG. 2 are shown as single transistors; however, in practice, each transistor may be implemented using a number of smaller transistors connected in parallel.

Pull-down driver 103 comprises two NMOS transistors, NMOS pull-down transistor 104 and NMOS pull-down transistor 106. NMOS pull-down transistor 104 has a gate coupled to first supply voltage VDD and a drain coupled to pad 108. Among other features, NMOS pull-down transistor 104 improves the reliability and longevity of the output buffer by increasing transistor reliability by protecting NMOS pull-down transistor 106 from extreme high voltage stresses applied at pad 108. For example, NMOS pull-down transistor 106 may breakdown when high voltages are coupled directly to its drain. However, other techniques exist to provide highvoltage protection for NMOS pull-down transistor 106, such as using a thicker gate oxide. Therefore, in other embodiments of the present invention, NMOS pull-down transistor 104 may be omitted, and the output buffer will still function and provide overvoltage tolerance. Pull-down transistor 106 has a gate coupled to the VPD signal generated by predriver circuit 100, a drain coupled to a source of NMOS pull-down transistor 104, and a source coupled to second supply voltage VSS.

As mentioned above, the gate of PMOS pull-up transistor 102 is coupled to the VPU signal through passgate 109. Passgate 109, comprises an NMOS pass transistor 110 coupled in parallel with a PMOS pass transistor 111. A gate of NMOS pass transistor 110 is coupled to first supply voltage VDD. A gate of PMOS pass transistor 111 is coupled to a voltage bias node 114.

A voltage at voltage bias node 114 is generated by a voltage bias generator 112. Voltage bias generator 112 comprises an inverter 119 having an output connected to input of an NMOS pass transistor 118. Inverter 119 may be designed using any process technology including bipolar, NMOS, CMOS, and BiCMOS technologies. An input of voltage bias generator 112, also an input of inverter 119, is coupled to an output enable signal 116. An output of inverter 119 is coupled through NMOS pass transistor 118 to voltage bias node 114. A gate of NMOS pass transistor 118 is coupled to first supply voltage VDD. An output of voltage bias generator 112, also an output of NMOS pass transistor 118, is coupled to voltage bias node 114.

In operation, voltage bias generator 112 generates a first reference voltage at voltage bias node 114 when the output buffer is in a normal operation state and a second reference voltage at voltage bias node 114, typically at a voltage level above the first reference voltage, when the output buffer is in a high-impedance or tristate state. In the normal operation state, the first reference voltage is typically about VSS or ground. In the high-impedance state, the reference voltage is typically at least about VDD −VTN. Whether the output buffer is in a normal operation or high-impedance state is determined by the state of the output enable signal 116. When output enable signal 116 is a logic low, the output buffer is in a high-impedance state; otherwise, when output enable signal 116 is a logic high, the output buffer is in a normal operation state.

The circuitry further includes first and second PMOS tracking transistors 120 and 122. Tracking transistor 120 is coupled between the gate of PMOS pull-up transistor 102 and pad 108, and has a gate coupled to first supply voltage VDD. Tracking transistor 122 is coupled between pad 108 and voltage bias node 114, and has a gate coupled to first supply voltage VDD. Furthermore, a coupling capacitor 124 is coupled between pad 108 and voltage bias node 114.

As mentioned above, the voltages at the gates of PMOS tracking transistors 120 and 122 are at a voltage level approximately equal to the first supply voltage VDD. In further embodiments these voltages need not approximately be at the voltage level of first supply voltage VDD, but may be at another voltage reference. Apparent to those of skill in the art, the output buffer of the present invention will still function properly and address the problems of the prior art output buffer if the voltage at the gates of tracking transistors 120 and 122 were at, for example, VDD- |VTP|. Also, the voltages of the gates of tracking transistors 120 and 122 need not be the same. The output buffer of the present invention would still function properly in these cases. Since voltage reference circuits usually occupy a portion of valuable integrated circuit area, in the present embodiment, first supply voltage VDD was selected as a reference voltage for first PMOS tracking transistor 120 and second PMOS tracking transistor 122 because of the general availability of VDD and minimal impact on increasing integrated circuit size.

PMOS transistors 102, 111, 120, and 122 have a substrate connection, not shown in FIG. 2, which is typically a floating n-well connection. This n-well connection is not directly connected to supply voltage VDD as is typically the case with other PMOS transistors on the integrated circuit. Because of the physical nature of a semiconductor integrated circuit, in practice, a parasitic diode (substrate diode) exists between the floating n-well and pad 108. Therefore, the substrate connections of PMOS transistors 102, 111, 120, and 122 need not be physically connected together; instead, these transistors may have unconnected floating n-well connections that are effectively at the same potential, all having a parasitic diode connection to pad 108. In this situation, the n-well or substrate of PMOS transistors 102, 111, 120, and 122 will be effectively electrically, or virtually, connected.

In operation, the floating n-well connection for PMOS transistors 102, 111, 120, and 122 helps prevent the occurrence of a latch-up condition. Since there is a parasitic diode (substrate diode) between pad 108 and the n-well connections of the PMOS transistors, the n-well of these transistors will track the pad 108 voltage when a voltage above VDD is applied to pad 108. Moreover, the n-well voltage will be about the pad 108 voltage less a threshold voltage of the parasitic diode. This prevents forward biasing the parasitic diode of PMOS transistors 102, 111, 120, and 122, thus preventing the occurrence of a latch-up condition.

OPERATION UNDER OVERVOLTAGE CONDITIONS

The output buffer shown in FIG. 2 is an output buffer with improved tolerance to overvoltage conditions. Furthermore, the output buffer of FIG. 2 addresses the problems with the prior art output buffer of FIG. 1, described and referred to as Problems 1 through 3 in the Background of the Invention section. An overvoltage condition occurs when a voltage level greater than first supply voltage VDD is applied at pad 108. Specifically, the present invention overcomes Problems 1 through 3. The manner in which this is accomplished will be explained with specific reference to the prior art circuit, followed by a discussion of the present invention's operation.

PROBLEM 1

This is the leakage problem when PMOS pull-up driver 22 tristates after a low-to-high transition at pad 24. Then, PMOS pass transistor 17 is off since its gate, coupled to pad 24, is a high. Since the gate of PMOS pull-up transistor 22 can only charge to VDD-VTN through NMOS pass transistor 16, PMOS pull-up transistor 22 remains on. If pad 24 is driven, externally or otherwise, to some voltage above VDD, but just under VDD +|VTP|, PMOS tracking transistor 20 does not turn on. As a result, the source-to-gate voltage of PMOS pull-up transistor 22 is equal to |VTP|+ VTN which causes very serious leakage into supply voltage VDD through PMOS pull-up transistor 22.

More specifically, when a high VPU signal 12 is passed through passgate transistors 16 and 17, PMOS pass transistor 17 is off since its gate is at the same potential, a high voltage, as pad 24. Consequently, a high VPU 12 signal is passed solely by NMOS pass transistor 16, which can only pass a voltage of VDD-VTN. VTN is a threshold voltage of NMOS pass transistor 16 including body effect. Hence, the voltage at the gate of PMOS pull-up transistor 22 is VDD −VTN. Therefore, PMOS pull-up transistor 22 remains slightly on; and when a voltage between VDD and VDD +|VTP| is applied at pad 24, leakage will occur from pad 24 into supply voltage VDD because PMOS tracking transistor 20 is not on and will not track the voltage at the gate of PMOS pull-up transistor 22 with the voltage at pad 24.

As shown in FIG. 2, the present invention does not have this shortcoming of the prior art output buffer because in the high-impedance state, voltage bias node 114 is at VDD-VTN. Consequently PMOS pass transistor 111 is on, allowing a full VDD-level VPU signal at the gate of PMOS pull-up transistor 102. PMOS pull-up transistor 102 will be completely off and no leakage current path can occur from pad 108 to supply voltage VDD when a voltage above VDD, but just under VDD +|VTP| is applied at pad 108.

Specifically, the present invention solves this leakage problem because PMOS tracking transistor 122 decouples the gate of PMOS pass transistor 111 from a voltage at pad 108. A voltage at the gate of PMOS pass transistor 111 is generated by voltage bias generator 112 at voltage bias node 114. When the output buffer is in a high-impedance state, output enable signal 116 is a low, and voltage bias node 114 has a value depending on the voltage level at pad 108. If the voltage level at pad 108 is in a range from VSS to VDD +|VTP|, then the voltage bias node 114 is at a voltage of about VDD-VTN (VTN is a threshold voltage of NMOS pass transistor 118). A voltage of VDD-VTN on the gate of PMOS pass transistor 111 keeps this transistor slightly on. Consequently, PMOS pass transistor will pass a voltage, equal or approximately equal to VDD, to the gate of PMOS pull-up transistor 102. This ensures that PMOS pull-up transistor 102 is completely off and no leakage will occur when a voltage level from VDD to VDD +|VTP| is placed on pad 108.

Furthermore, when a voltage level greater than VDD +|VTP| is placed on pad 108, the present invention also prevents any leakage path from pad 108 through PMOS pull-up transistor 102 to first supply voltage VDD. More specifically when a voltage at pad 108 is at least VDD +|VTP|, the gate voltage of PMOS pull-up transistor 102 will be equal to the voltage at pad 108. This results from first PMOS tracking transistor 120 allowing the gate of PMOS pull-up transistor 102 to track a voltage at pad 108, thus ensuring PMOS pull-up transistor 102 is always off regardless of a voltage level at pad 108. In addition, the gate of PMOS pass transistor 111 tracks pad 108 through PMOS tracking transistor 122, in a similar fashion to PMOS tracking transistor 120, insuring PMOS pass transistor 111 remains off to prevent leakage to the predriver.

Therefore, the present invention provides an output buffer where no leakage path occurs through PMOS pull-up transistor 102 for the entire range of overvoltage situations. Consequently, the present invention solves this leakage problem of the prior art output buffer. Furthermore, since significant leakage currents reduce the life span of integrated circuits due to hot electrons and the electromigration phenomenon degrading the electrical characteristics of semiconductor devices and other electrical materials on the integrated circuit, the present invention improves the longevity and reliability of integrated circuits.

PROBLEM 2

This is the problem of crossover current. For the prior art output buffer, during normal operation (when output enable signal 116 is high), a high-to-low transition at pad 24 suffers a built-in crossover current between VDD and VSS supplies because PMOS pull-up transistor 22 is not completely turned-off until NMOS pull-down transistors 26 and 28 have adequately discharged pad 24. Until the gate of PMOS pass transistor 17 is at about VSS or ground, the gate of PMOS pull-up transistor will be VDD-VTN, as discussed earlier. Also described earlier, this crossover current causes problems such as ground bounce and false clocking, and also slows transient response.

The embodiment of the present invention shown in FIG. 2 addresses this crossover problem. In normal operation, output enable signal 116 is a logic high and consequently, voltage bias generator 112 generates VSS or ground at voltage bias node 114. Since second PMOS tracking transistor 122 decouples pad 108 from the gate of PMOS pass transistor 111, the voltage level at the gate of PMOS pass transistor 111 will be VSS or ground. Therefore, PMOS pass transistor 111 is fully on and will pass a full VDD-level VPU signal to the gate of PMOS pull-up transistor 102.

When a high-to-low transition occurs at pad 108, no crossover current will occur because PMOS pull-up transistor 102 is completely off since the gate of this transistor is at about VDD. Therefore, the present invention solves the crossover current problem of the prior art, thereby reducing any ground bounce problems and also improving the transient response, enabling the production of high-speed integrated circuits.

PROBLEM 3

This is the problem of the transient current into the predriver that occurs when the output buffer is in a high-impedance state and pad 24 switches from a low voltage to a voltage greater than VDD +|VTP|. In that case, for the prior art output buffer, the gate of PMOS pull-up transistor 22 is capacitively coupled above VDD. This increases the source bias on PMOS pass transistor 17, effectively turning it on, allowing a transient current to flow back into predriver circuit 10.

However, in the output buffer of the present invention, this transient current does not occur because capacitor 124, responsive to a low-to-high transition at pad 108, quickly and dynamically couples voltage bias node 114 up sufficiently such that the gate source voltage of PMOS pass transistor 111 is less than |VTP|. This effectively turns PMOS pass transistor 111 off, blocking any current flow back into predriver circuit 100. Furthermore, second PMOS tracking transistor 122 ensures that PMOS pass transistor 111 remains off by holding the gate of PMOS pass transistor 111 at a voltage level at pad 108 during an overvoltage situation (i.e., when a voltage level at pad 108 is greater than VDD +|VTP|). Therefore, the output buffer of the present invention solves this transient current problem of the prior art output buffer. Consequently, the output buffer of the present invention reduces the effects of the electromigration phenomenon and increases the longevity of semiconductor integrated circuits by preventing the circuitry in predriver circuit 100 from being subjected to unnecessary transient currents.

A potential leakage problem occurs when the output buffer is in the high-impedance state and pad 24 switches from a voltage greater than VDD +|VTP| to VSS or ground. In that case, because of gate overlap capacitance and other parasitic capacitances, the gate of PMOS pull-up transistor 22 is capacitively coupled down far enough to turn PMOS pull-up transistor 22 on. This creates a conducting path from supply voltage VDD through the source-to-drain path of PMOS pull-up transistor 22 to pad 24, which will be at or near a VSS or ground potential at the end of the the transition. Therefore, there is a conducting path between VDD and VSS supplies until PMOS pull-up transistor 22 turns off.

This problem does not occur in the output buffer of the present invention since coupling capacitor 124 quickly and dynamically couples voltage bias node 114 down sufficiently to turn PMOS pass transistor 111 on, allowing the gate of PMOS pull-up transistor 102 to be refreshed to VDD, turning off PMOS pull-up transistor 102, and preventing or minimizing any conducting path.

ALTERNATIVE EMBODIMENT

Figure 3:
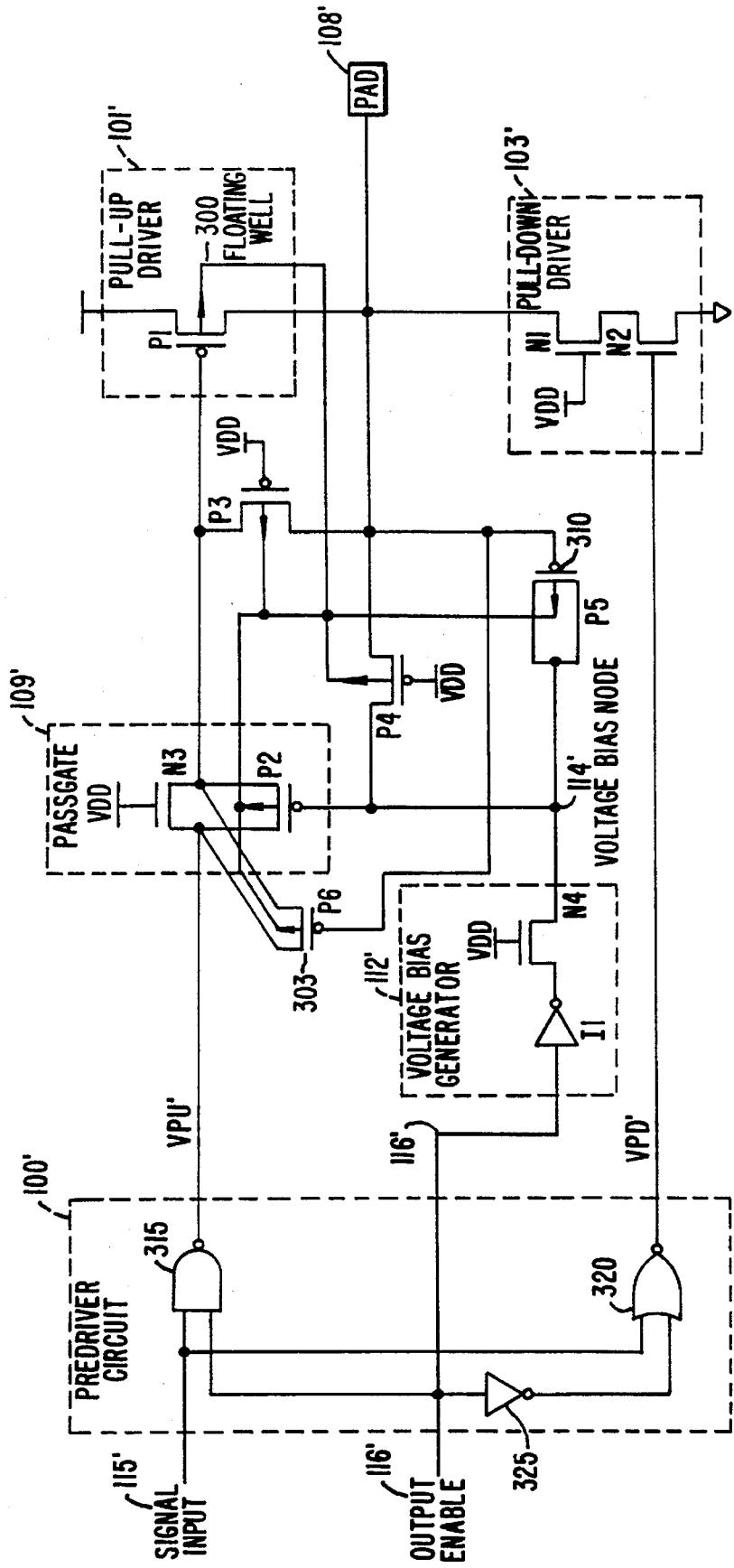
FIG. 3 depicts a further embodiment of the CMOS output buffer of the present invention that is tolerant to overvoltage.

FIG. 3 shows a circuit diagram for another embodiment of the output buffer of the present invention. Like reference numerals in FIG. 3 refer to like elements of FIG. 2. For example, pull-up driver 101' of FIG. 3 is equivalent to pull-up driver 101 of FIG. 2. The connections of the transistors and components of FIG. 3 are largely equivalent to the connections in FIG. 2 and will not be described here since these were described previously. However, the differences between FIG. 3 and FIG. 2 will be discussed.

A floating n-well connection 300 is shown for all PMOS transistors in FIG. 3, namely transistors P1, P2, P3, P4, P5, and P6. As discussed earlier, a floating n-well connection 300 for these PMOS transistors helps prevent the occurrence of a latch-up condition. This n-well 300 is not directly connected to supply voltage VDD as is typically the case with other PMOS transistors on the integrated circuit. Since there is a parasitic diode (substrate diode) between pad 108' and the n-well connection 300 of PMOS transistors P1, P2, P3, P4, P5, and P6, the n-well of these transistors will track the pad voltage when the voltage above VDD is applied to the pad. This prevents forward biasing the parasitic diode of the PMOS transistors, thus preventing the occurrence of a latch-up condition.

Furthermore, the n-well or substrate connections of these PMOS transistors need not be physically connected together as shown in FIG. 3; any number of these PMOS transistors may have separate unconnected floating n-well or substrate connections that are effectively at the same potential, all having parasitic diode connections to pad 108'. In this situation, the n-well or substrate connections of PMOS transistors P1, P2, P3, P4, P5, and P6 will be effectively electrically, or virtually, connected.

Predriver circuit 100' shows an embodiment of predriver circuit 100. Predriver circuit 100' comprises a NAND gate 315, a NOR gate 320, and an inverter 325. NAND gate 315 has two inputs, a signal input 115' and output enable 116'. The input of inverter 325 is connected to output enable 116'. The inputs of NOR gate 320 and are connected to signal input 115' and an output of inverter 325. The output of NAND gate 315 generates a VPU' signal which is analogous to the VPU signal of FIG. 2. The output of NOR gate 320 generates VPD' signal which is analogous to the VPD signal of FIG. 2. This particular implementation of predriver circuit 100' performs all the functions as described for predriver circuit 100 of FIG. 2. Furthermore, NAND gate 315, NOR gate 320, and inverter 325 may be implemented in any process technology including NMOS, CMOS, and BiCMOS, or any combination of these.

In FIG. 3, PMOS transistor 310 is used to form a capacitor which is equivalent to coupling capacitor 124 of FIG. 2. One terminal of the capacitor, a source and a drain of PMOS transistor 310, is coupled to voltage bias node 114', and the other terminal, a gate of PMOS transistor 310, is coupled to pad 108'. The capacitor formed by PMOS transistor 310 performs the same function as coupling capacitor 124. Moreover, the coupling of the capacitor's terminals may be reversed without affecting the functionality of the circuitry. Furthermore, instead of PMOS transistor 310, a capacitor could be formed using an NMOS transistor coupled in a similar fashion as shown in FIG. 3.

Another difference between the embodiment of the present invention of FIG. 3 and FIG. 2 is PMOS pass transistor 303. PMOS pass transistor 303, coupled in parallel with NMOS pass transistor N3 and PMOS pass transistor P2, couples VPU' with the gate of PMOS pull-up transistor P1. PMOS pass transistor 303 is included in the event that the capacitor formed by PMOS transistor 310 does not pull voltage bias node 114' down far enough to prevent a conducting path from supply voltage VDD through PMOS pull-up transistor P1 to pad 108' which occurs when pad 108' switches from a voltage greater than VDD +|VTP|to VSS or ground. A circuit as shown in FIG. 3 with PMOS pass transistor P6, but without the capacitor formed by PMOS transistor 310 would solve the problem of a conducting path between supply voltage VDD and pad 108'(since PMOS pass transistor 303 insures a full VDD will be passed to PMOS pull-up transistor P1); however, the addition of this capacitor speeds up the process of preventing this conducting path, thus improving the transient response characteristics of the output buffer.

SUBSTRATE BIAS GENERATOR

Figure 4:
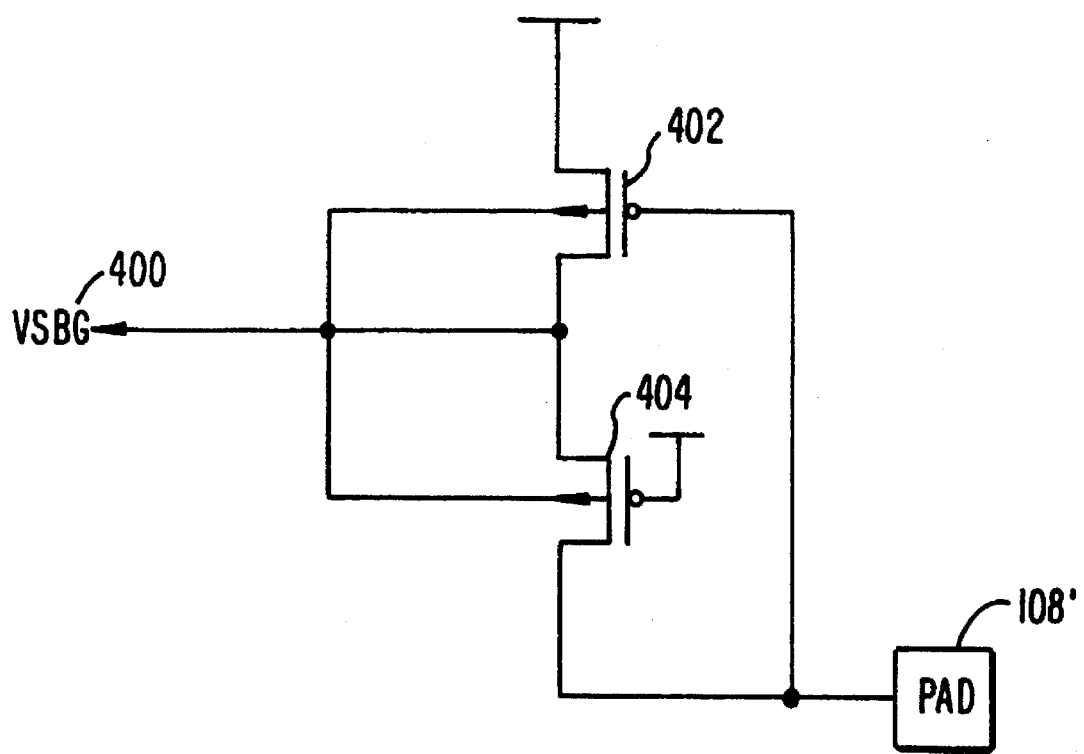
FIG. 4 depicts a substrate bias generator for use in an embodiment of the present invention.

FIG. 4 shows a substrate bias generator which may be used in other embodiments of the present invention to generate a bias voltage for n-well connection 300 of PMOS transistors P1, P2, P3, P4, P5, and P6. This substrate bias generator may also be used with the output buffer circuits shown in FIGS. 1 and 2 in a similar fashion.

Figure 1:
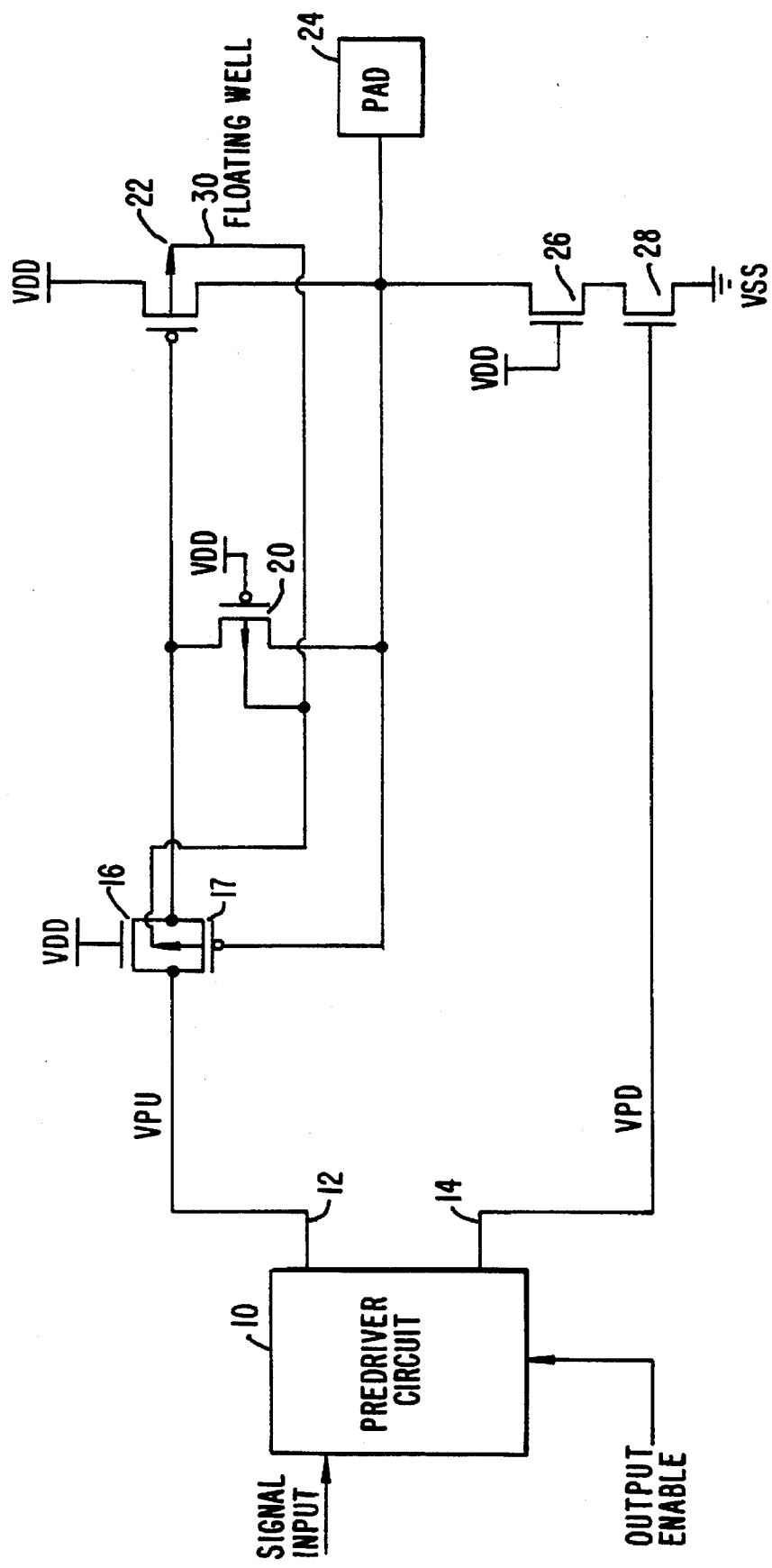
FIG. 1 depicts a prior art CMOS output buffer tolerant to overvoltage.

As discussed earlier, the floating n-well or substrate connections in FIGS. 1, 2, and 3 will track the voltage at pads 24, 108, and 108' respectively, due to a parasitic diode (substrate diode). The substrate bias generator shown in FIG. 4 gives improved electrical characteristics for n-well connection 300 compared to a parasitic diode. In particular, when using the substrate bias generator, n-well connection 300 will be about VDD when the pad 108' voltage is less than about supply voltage VDD. And, when the pad 108' voltage is above supply voltage VDD, the n-well connection will track the pad 108' voltage in a similar fashion to the parasitic diode situation.

One advantage, among others, of using this substrate bias generator is that n-well connection 300 will track overvoltage situations on pad 108' more quickly. For example, a signal at pad 108' may overshoot VDD during a transition, causing the voltage at pad 108' to rise above supply voltage VDD. When using the substrate bias generator of FIG. 4, n-well connection 300 begins tracking the voltage at pad 108' starting from about a VDD +|VTP| level (|VTP| is less than a built-in potential). A VDD level, which is not necessarily the case when using a parasitic diode. The voltage differential which n-well connection 300 needs to track is reduced and the corresponding transient response is also reduced. Therefore, the substrate bias generator of the present invention allows n-well connection 300 to more quickly respond to and track overvoltage situations at pad 108'.

As shown in FIG. 4, a VSBG 400 signal is an output of the substrate bias generator. In the output buffer of FIG. 3, VSBG 400 will typically be coupled to n-well connection 300 of PMOS transistors P1, P2, P3, P4, P5, and P6. This substrate bias generator may also be used similarly with the output buffers in FIGS. 1 and 2 by coupling VSBG 400 to the floating n-well or substrate connections of the analogous PMOS transistors.

The substrate bias generator has a PMOS transistor 402 and a PMOS transistor 404. A gate of PMOS transistor 402 is coupled to pad 108'. PMOS transistor 402 is coupled between supply voltage VDD and VSBG 400. An n-well or substrate of PMOS transistor 402 is coupled to VSBG 400. A gate of PMOS transistor 404 is coupled to supply voltage VDD. PMOS transistor 404 is coupled between VSBG 400 and pad 108'. An n-well or substrate of PMOS transistor 404 is coupled to VSBG 400.

In operation, when the voltage at pad 108' is less than about VDD- |VTP|, PMOS transistor 402 is on and VSBG 400 is about equal to supply voltage VDD. When pad 108' is above VDD-VTP, PMOS transistor 402 is off and VSBG 400 will track the voltage at pad 108' as in the parasitic diode case described above. Moreover, since its gate is at VDD, PMOS transistor 404 is off. Consequently, when the voltage at pad 108' is less than VDD- |VTP|, PMOS transistor 404 prevents current flow from supply voltage VDD through PMOS transistors 402 and 404 to pad 108. Therefore, the substrate bias generator of FIG. 4 consumes substantially no power.

CONCLUSION

In conclusion, the present invention provides an improved output buffer with improved tolerance to overvoltage, without the problems and drawbacks of the prior art output buffer as described above. More specifically, among its features and improvements, the present invention prevents a leakage path to VDD for all overvoltage situations on pad 108, prevents crossover current during high-to-low transitions in normal operation mode, prevents a leakage path to VDD during low-to-high transitions, and prevents transient current flow into predriver 100 during low-to-high transitions.

The foregoing description of preferred embodiments of the invention has been presented for purposes of illustration and description. It is not intended to be exhaustive or to limit the invention to the precise form described, and many modifications and variations are possible in light of the above teaching. In particular, in addition to the alternatives already described, other such modifications to the present invention include forming coupling capacitor 124 using a single MOS or depletion NMOS transistor, providing an ESD structure coupled with pull-down driver 103 to protect the semiconductor devices and circuitry from electrostatic discharge, and implementing pull-up driver 101 using multiple transistors.

The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. An output buffer, having a normal operation state and a high-impedance state, comprising:
   a pad, for providing and receiving a signal;
   a passgate, comprising a first transistor having a gate coupled to a first supply voltage and a second transistor coupled in parallel with said first transistor and having a gate coupled to a voltage bias node;
   a voltage bias generator, coupled to said voltage bias node, said voltage bias generator generates a first reference voltage when the output buffer is in the normal operation state and a second reference voltage when the output buffer is in the high-impedance state;
   a pull-up transistor, having a source-to-drain path operatively coupling said first supply voltage to said pad, wherein said pull-up transistor provides a controlled variable impedance along said source-to-drain path in response to a control signal from a predriver coupled to a gate of said pull-up transistor through said passgate;
   a first tracking transistor, coupled between a gate of said pull-up transistor and said pad and having a gate coupled to said first supply voltage;
   a second tracking transistor, coupled between said pad and said voltage bias node and having a gate coupled to said first supply voltage; and
   a coupling capacitor, coupled between said pad and said voltage bias node.

2. The output buffer of claim 1 further comprising:
   a pull-down transistor, having a gate coupled to said predriver and having a drain-to-source path operatively coupling a second supply voltage to said pad.

3. The output buffer of claim 1 further comprising:
   a first pull-down transistor, having a gate coupled to said first supply and having a drain coupled to said pad; and
   a second pull-down transistor, having a gate coupled to said predriver and having a drain-to-source path operatively coupling a second supply voltage to said pad through a source of said first pull-down transistor.

4. The output buffer of claim 1 wherein said first reference voltage is about equal to a second supply voltage.

5. The output buffer of claim 1 wherein said second reference voltage is at least said first supply voltage less a transistor threshold voltage.

6. The output buffer of claim 1 wherein said second reference voltage is about equal to a pad voltage when said pad voltage is greater than said first supply voltage plus a transistor threshold voltage, and said second reference voltage is less than said first supply voltage less said transistor threshold voltage when said pad voltage is less than said first supply voltage plus said transistor threshold voltage.

7. The output buffer of claim 1 wherein said second reference voltage is about equal to a pad voltage when said pad voltage is greater than said first supply voltage plus a transistor threshold voltage, and said second reference voltage is about equal to said first supply voltage less said transistor threshold voltage when said pad voltage is less than said first supply voltage plus said transistor threshold voltage.

8. The output buffer of claim 1 wherein said voltage bias generator comprises:
   an inverter, having an input coupled to an output enable signal and having an output; and
   a passgate, comprising a third transistor having a gate coupled to said first supply voltage, said passgate couples said voltage bias node to said output of said inverter.

9. The output buffer of claim 1 wherein said coupling capacitor comprises:
   a PMOS transistor, having a gate coupled to said pad, and having a source and a drain coupled to said voltage bias node.

10. The output buffer of claim 1 wherein said coupling capacitor comprises:
    an NMOS transistor, having a gate coupled to said pad, and having a source and a drain coupled to said voltage bias node.

11. The output buffer of claim 1 wherein said pullup transistor is a PMOS transistor.

12. The output buffer of claim 1 wherein said first tracking transistor is a PMOS transistor.

13. The output buffer of claim 1 wherein said second tracking transistor is a PMOS transistor.

14. The output buffer of claim 11 wherein a well of said pull-up transistor is floating.

15. The output buffer of claim 11 wherein a well of said pull-up transistor is coupled to said pad through a parasitic diode.

16. The output buffer of claim 12 wherein a well of said first tracking transistor is floating.

17. The output buffer of claim 12 wherein a well of said first tracking transistor is coupled to said pad through a parasitic diode.

18. The output buffer of claim 13 wherein a well of said second tracking transistor is floating.

19. The output buffer of claim 13 wherein a well of said second tracking transistor is coupled to said pad through a parasitic diode.

20. The output buffer of claim 1 wherein said pullup transistor, first tracking transistor, second tracking transistor, and second transistor are PMOS transistors, and wherein each of said pull-up transistor, first tracking transistor, second tracking transistor, and second transistor has a floating well.

21. The output buffer of claim 1 wherein said pullup transistor, first tracking transistor, second tracking transistor, and second transistor are PMOS transistors, and wherein each of said pull-up transistor, first tracking transistor, second tracking transistor, and second transistor has a well coupled to said pad through a parasitic diode.

22. The output buffer of claim 2 wherein said first transistor and pull-down transistor are NMOS transistors.

23. The output buffer of claim 3 wherein said first transistor, first pull-down transistor, and second pull-down transistor are NMOS transistors.

24. The output buffer of claim 1 wherein said predriver comprises a buffer, wherein in the normal operation state, said buffer provides an output in response to an internal data signal representing a boolean logic state, and wherein in the high-impedance state, said buffer provides a high logic state.

25. The output buffer of claim 2 wherein said predriver comprises a buffer, wherein in the normal operation state, said buffer provides an output in response to an internal data signal representing a boolean logic state, and wherein in the high-impedance state, said buffer provides a high logic state to said pull-up transistor and a low logic state to said pull-down transistor.

26. The output buffer of claim 1 further comprising a third transistor in parallel with said first transistor and having a gate coupled to said pad.

27. The output buffer of claim 1 further comprising:
a substrate bias generator having an output coupled to a well of said pull-up transistor, comprising:
a first PMOS bias transistor, coupled between said first supply voltage and said output of said substrate bias generator, wherein a gate of said first PMOS bias transistor is coupled to said pad, wherein a well of said first PMOS bias transistor is coupled to said output of said substrate bias generator; and
a second PMOS bias transistor, coupled between said output of said substrate bias generator and said pad, wherein a gate of said second PMOS bias transistor is coupled to said first supply voltage, wherein a well of said second PMOS bias transistor is coupled to said output of said substrate bias generator.

28. The output buffer of claim 1 further comprising:
a substrate bias generator having an output coupled to a well of said second tracking transistor, comprising:
a first PMOS bias transistor, coupled between said first supply voltage and said output of said substrate bias generator, wherein a gate of said first PMOS bias transistor is coupled to said pad, wherein a well of said first PMOS bias transistor is coupled to said output of said substrate bias generator; and
a second PMOS bias transistor, coupled between said output of said substrate bias generator and said pad, wherein a gate of said second PMOS bias transistor is coupled to said first supply voltage, wherein a well of said second PMOS bias transistor is coupled to said output of said substrate bias generator.

29. The output buffer of claim 1 further comprising:
a substrate bias generator having an output coupled to a well of said first tracking transistor, comprising:
a first PMOS bias transistor, coupled between said first supply voltage and said output of said substrate bias generator, wherein a gate of said first PMOS bias transistor is coupled to said pad, wherein a well of said first PMOS bias transistor is coupled to said output of said substrate bias generator; and
a second PMOS bias transistor, coupled between said output of said substrate bias generator and said pad, wherein a gate of said second PMOS bias transistor is coupled to said first supply voltage, wherein a well of said second PMOS bias transistor is coupled to said output of said substrate bias generator.

30. An output buffer, having a normal operation state and a high-impedance state, comprising:
a pad, for providing and receiving a signal;
a passgate, comprising a first transistor having a gate coupled to a first supply voltage and a second transistor coupled in parallel with said first transistor and having a gate coupled to a voltage bias node;
a voltage bias generator, coupled to said voltage bias node, said voltage bias generator generates a first reference voltage when the output buffer is in the normal operation state and a second reference voltage when the output buffer is in the high-impedance state, wherein said first reference voltage is about equal to a second supply voltage, wherein said second reference voltage is about equal to a pad voltage when said pad voltage is greater than said first supply voltage plus a transistor threshold voltage and said second reference voltage is about equal to said first supply voltage less said transistor threshold voltage when said pad voltage is less than said first supply voltage plus said transistor threshold voltage;
a pull-up transistor, having a source-to-drain path operatively coupling said first supply voltage to said pad, wherein said pull-up transistor provides a controlled variable impedance along said source-to-drain path in response to a control signal from a predriver coupled to a gate of said pull-up transistor through said passgate;
a pull-down transistor, having a gate coupled to said predriver and having a drain-to-source path operatively coupling said second supply voltage to said pad;
a first tracking transistor, coupled between a gate of said pull-up transistor and said pad and having a gate coupled to said first supply voltage;
a second tracking transistor, coupled between said pad and said voltage bias node and having a gate coupled to said first supply voltage; and
a coupling capacitor, coupled between said pad and said voltage bias node.

31. A floating-well MOS output buffer for producing a signal on a pad of an integrated circuit comprising:
a pull-up driver, coupled to the pad and a first supply voltage, for connecting said first supply voltage to the pad;
a pull-down driver, coupled to the pad and a second supply voltage, for connecting said second supply voltage to the pad;
a first transistor, coupled between the pad and a control node of said pull-up driver;
a second transistor, coupled between said pad and a voltage bias node; and
a voltage bias generator for generating a signal at said voltage bias node.

32. The floating-well MOS output buffer of claim 31 further comprising:
a capacitor coupled between the pad and said voltage bias node.

33. The floating-well MOS output buffer of claim 31 further comprising:
a passgate coupled to transfer a control signal to said control node, said passgate comprising a third transistor having a control node coupled to said voltage bias node.

34. The floating-well MOS output buffer of claim 31 wherein said voltage bias generator generates a first reference voltaqe when the output buffer is in a normal operation state and a second reference voltage when the output buffer is in a high-impedance state.

35. A floating-well MOS output buffer for producing a signal on a pad of an integrated circuit comprising:
a pull-up driver, coupled to the pad and a first supply voltage, for connecting said first supply voltage to the pad;

a pull-down driver, coupled to the pad and a second supply voltage, for connecting said second supply voltage to the pad;

a predriver, coupled to a control node of said pull-up driver, said first supply voltage, and said second supply voltage, for driving said pull-up driver; and a first transistor, coupled between said predriver and said control node of said pull-up driver, and having a gate coupled to a voltage bias node;

a second transistor coupled between the pad and said voltage bias node, wherein said second transistor decouples the pad from said gate of said first transistor.

36. A floating-well MOS output buffer for producing a signal on a pad of an integrated circuit comprising:

a pull-up driver, coupled to the pad and a first supply voltage, for connecting said first supply voltage to the pad;

a pull-down driver, coupled to the pad and a second supply voltage, for connecting said second supply voltage to the pad;

a predriver for controlling said pull-up driver;

a first transistor coupling said predriver to a control node of said pull-up driver, and having a gate coupled to a voltage bias node;

a coupling capacitor coupled between the pad and said voltage bias node.

37. A floating-well MOS output buffer for producing a signal on a pad of an integrated circuit comprising:

a pull-up driver, coupled to the pad and a first supply voltage, for connecting said first supply voltage to the pad;

a pull-down driver, coupled to the pad and a second supply voltage, for connecting said second supply voltage to the pad;

a first transistor, coupled between the pad and a control node of said pull-up driver;

a second transistor, coupled between said pad and a voltage bias node; and a third transistor, coupled between a predriver and said control node of said pull-up driver, and having a gate coupled to a voltage bias node.

* * * * *